United States Patent
Herrmann

(10) Patent No.: US 9,543,479 B2
(45) Date of Patent: Jan. 10, 2017

(54) METHOD FOR PRODUCING AN OPTOELECTRONIC COMPONENT AND OPTOELECTRONIC COMPONENT PRODUCED IN SUCH A WAY

(71) Applicant: OSRAM Opto Semiconductors GmbH, Regensburg (DE)

(72) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 26 days.

(21) Appl. No.: 14/380,688

(22) PCT Filed: Feb. 22, 2013

(86) PCT No.: PCT/EP2013/053565
§ 371 (c)(1),
(2) Date: Aug. 22, 2014

(87) PCT Pub. No.: WO2013/124420
PCT Pub. Date: Aug. 29, 2013

(65) Prior Publication Data
US 2015/0303353 A1     Oct. 22, 2015

(30) Foreign Application Priority Data
Feb. 23, 2012   (DE) .................. 10 2012 101 463

(51) Int. Cl.
*H01L 23/495*   (2006.01)
*H01L 33/48*    (2010.01)
*H01L 33/62*    (2010.01)

(52) U.S. Cl.
CPC .......... *H01L 33/483* (2013.01); *H01L 33/486* (2013.01); *H01L 33/62* (2013.01); *H01L 2924/0002* (2013.01); *H01L 2933/0033* (2013.01)

(58) Field of Classification Search
CPC ...... H01L 33/483; H01L 33/486; H01L 33/62; H01L 2924/0002; H01L 2933/0033
(Continued)

(56) References Cited

U.S. PATENT DOCUMENTS

| | | |
|---|---|---|
| 4,870,224 A | 9/1989 | Smith et al. |
| 5,706,177 A | 1/1998 | Nather et al. |

(Continued)

FOREIGN PATENT DOCUMENTS

| | | |
|---|---|---|
| DE | 4446566 A1 | 6/1996 |
| DE | 112005003345 T5 | 11/2007 |

(Continued)

*Primary Examiner* — Earl Taylor
*Assistant Examiner* — Samuel Park
(74) *Attorney, Agent, or Firm* — Slater Matsil, LLP

(57) ABSTRACT

A semiconductor chip without a substrate is provided on an electrically insulating carrier. The carrier has electrically conductive contact metallizations. Furthermore, an electrically conductive carrier substrate and a covering substrate are provided. The covering substrate has electrically conductive contact structures. The carrier is attached to the carrier substrate. Subsequently, the covering substrate is attached to the semiconductor chip and/or to the carrier. The electrically conductive contact structures are connected in an electrically conductive manner to the electrically conductive contact metallizations and the electrically conductive carrier substrate.

13 Claims, 6 Drawing Sheets

(58) Field of Classification Search
USPC .............. 257/704, 710, 727, 659, E23.193
See application file for complete search history.

(56) References Cited

U.S. PATENT DOCUMENTS

| | | | |
|---|---|---|---|
| 7,265,392 B2 | 9/2007 | Hahn et al. | |
| 7,300,182 B2 | 11/2007 | Mazzochette | |
| 2004/0208210 A1 | 10/2004 | Inoguchi | |
| 2006/0261453 A1* | 11/2006 | Lee .................. | H01L 25/105 |
| | | | 257/676 |
| 2008/0128724 A1 | 6/2008 | Isobe et al. | |
| 2011/0195532 A1 | 8/2011 | Lerman et al. | |
| 2011/0304015 A1* | 12/2011 | Kim .................. | H01L 23/552 |
| | | | 257/532 |
| 2012/0248492 A1 | 10/2012 | Müller et al. | |

FOREIGN PATENT DOCUMENTS

| | | |
|---|---|---|
| DE | 102009051746 A1 | 3/2011 |
| WO | 2008038574 A1 | 4/2008 |
| WO | 2011039023 A1 | 4/2011 |

\* cited by examiner

METHOD FOR PRODUCING AN OPTOELECTRONIC COMPONENT AND OPTOELECTRONIC COMPONENT PRODUCED IN SUCH A WAY

This patent application is a national phase filing under section 371 of PCT/EP2013/053565, filed Feb. 22, 2013, which claims the priority of German patent application 10 2012 101 463.9, filed Feb. 23, 2012, each of which is incorporated herein by reference in its entirety.

TECHNICAL FIELD

The invention relates to a method for producing an optoelectronic component comprising a substrateless chip. Furthermore, the present invention relates to an optoelectronic component comprising a substrateless semiconductor chip produced in such a way.

BACKGROUND

It is possible to use semiconductor chips in the production of optoelectronic components. The semiconductor chips can be applied to a carrier in order to ensure a sufficient stability of the component. For the electrical contact-connection of the semiconductor chip, plated-through holes are in this case lead through the carrier, thereby enabling an electrical contact-connection from that side of the carrier which faces away from the semiconductor chip. Components comprising plated-through holes are known from the document WO 2011/039023 A1, also published as U.S. Patent Publication 2012/0248492 A1, for example.

SUMMARY

Embodiments of the present application specify a method for producing an optoelectronic semiconductor component which is particularly cost-effective. Further embodiments of the present application specify an improved method which enables a simplified transfer of optical elements to such components. Yet further embodiments of the present application specify an optoelectronic semiconductor component produced in such a way.

In accordance with at least one embodiment, the method for producing an optoelectronic component comprises the following method steps:
A) providing a substrateless optoelectronic semiconductor chip arranged on a mounting surface of an electrically insulating carrier, wherein at least two electrically conductive contact metallizations which are electrically insulated from one another are applied on the mounting surface,
B) providing an electrically conductive carrier substrate,
C) providing a covering substrate, which has at least two electrically conductive contact structures which are electrically insulated from one another,
D) applying the carrier with optoelectronic semiconductor chip arranged thereon on the carrier substrate,
E) applying the covering substrate on the optoelectronic semiconductor chip and/or on the mounting surface of the carrier, and
F) electrically conductively connecting the electrically conductive contact structures to the electrically conductive contact metallizations and the electrically conductive carrier substrate.

In the present production method, a contact feedthrough in the carrier and/or in the carrier substrate is advantageously dispensed with. Instead of that, the contact feed to the semiconductor chip is achieved by the reshaping of the electrically conductive contact structures of the covering substrate. In this case, the contact structures of the covering substrate are connected to the contact metallizations arranged preferably in a planar fashion on the mounting surface of the carrier. Wire contact-connections, so-called wire bond contact-connections, such as conventionally used, are advantageously not necessary in the present case. In particular, a planar contact-connection with planar contact structures is employed. A very flat and very thin component can advantageously be produced as a result. Moreover, a particularly cost-effective production method can advantageously be ensured.

The carrier substrate is preferably a leadframe. The carrier of the semiconductor chip preferably comprises as materials $Al_2O_3$, SiN, a ceramic, a multilayer varistor ceramic or a ceramic on plastic-metal laminate with contact feeds to the foil rear side. In this case, the thermal conductivity of the carrier can be adapted and optimized to desired requirements by specific contact metallizations.

The semiconductor component is an optoelectronic component which makes it possible to convert electrically generated data or energy into light emission, or vice versa. The semiconductor component comprises an optoelectronic semiconductor chip, preferably a radiation-emitting semiconductor chip. The semiconductor chip is preferably an LED (light-emitting diode), particularly preferably a flip-chip LED. In the case of a flip-chip LED, the electrical contact-connection of the semiconductor chip is embodied in particular in an integral fashion. As a result, the radiation coupling-out surface of the semiconductor chip is advantageously free of contact structures. Consequently, no absorbent contact structures or current spreading layers that could at least partly absorb the light emitted by the semiconductor chip are arranged on the radiation coupling-out side of the semiconductor chip. Absorption losses at such contact layers or current spreading layers arranged at the radiation coupling-out surface are thus avoided in the present case, with the result that the light emission of the semiconductor component increases overall.

The semiconductor chip is a substrateless semiconductor chip in the present case. Substrateless here means, in particular, that the optoelectronic semiconductor chip comprises, for example, an epitaxially produced layer sequence provided for generating or detecting electromagnetic radiation during operation. A growth substrate is preferably completely removed from the epitaxially produced layer sequence of the semiconductor chip. In this way, an optoelectronic semiconductor chip is realized which is free of a growth substrate and is thus substrateless. It preferably has a thickness of less than 20 µm, for example, a thickness of between 2 µm and 6 µm inclusive. The substrateless optoelectronic semiconductor chip can be, for example, a light-emitting diode chip, a laser diode chip or a photodetector chip.

The semiconductor chip has in the layer stack an active layer preferably comprising a pn junction, a double heterostructure, a single quantum well (SQW) structure or a multi quantum well (MQW) structure for generating radiation. In this case, the designation quantum well structure does not exhibit any significance with regard to the dimensionality of the quantization. It encompasses, inter alia, quantum wells, quantum wires and quantum dots and any combination of these structures.

The layer stack of the semiconductor chip preferably contains a III-V semiconductor material. III/V semiconductor materials are particularly suitable for generating radiation in the ultraviolet through the visible to the infrared spectral range.

In particular, it is possible for the substrateless semiconductor chip to be free of a growth substrate and free of any other carrier body. The substrateless semiconductor chip can consist, for example, of an epitaxially grown semiconductor body and electrical contacts applied thereto. The semiconductor body is then self-supporting and is not mechanically supported by a carrier body. The semiconductor chip can be transparent, for example.

Method steps A) to F) of the production method according to the invention need not necessarily be carried out in the order specified. In particular, some method steps can be carried out temporally in parallel. Moreover, it may be the case that some method steps take place before the other method steps.

The covering substrate can have further component parts or elements in addition to the two electrically conductive contact structures. In this case, however, it is not absolutely necessary for the covering substrate to have further component parts and elements. In particular, the covering substrate can also consist only of the electrically conductive contact structures.

In method steps E) and F), preferably the contact structures of the covering substrate are applied directly and immediately on the contact metallizations of the carrier and are electrically and mechanically connected thereto. The contact structures of the covering substrate are thus preferably applied on the mounting surface of the carrier. In this case, after method step F), the electrically conductive contact structures connect the contact metallizations of the carrier to the electrically conductive carrier substrate arranged on that side of the carrier which faces away from the semiconductor chip.

In accordance with at least one embodiment, the carrier substrate and the contact structures of the covering substrate are embodied in an integral fashion. In this case, method steps B) and C) are realized simultaneously and by one component part. The contact structures of the covering substrate preferably form contact lugs of the carrier substrate. Preferably, the carrier substrate with the contact structures arranged thereon is a leadframe with contact lugs.

In accordance with at least one further embodiment, electrically conductively connecting in method step F) is effected by folding over the contact structures of the covering substrate. If the carrier substrate and the contact structures are embodied in an integral fashion, the contact structures or the contact lugs are accordingly folded by approximately 180° in the direction of the carrier substrate. In this case, the semiconductor chip with carrier is arranged on the carrier substrate, such that the contact structures are folded over the semiconductor chip and the carrier. After the folding process, therefore, at least the carrier is arranged between carrier substrate and contact structures of the covering substrate.

If the carrier substrate and the contact structures of the covering substrate are not embodied in an integral fashion, but rather in two pieces, that is to say as separate component parts, then for the purpose of electrically conductively connecting preferably the contact structures of the covering substrate are folded around the semiconductor chip and the carrier to the carrier substrate. In this case, too, at least the carrier is arranged between covering substrate and carrier substrate.

In accordance with at least one further embodiment, the carrier with semiconductor chip arranged thereon is bonded onto the carrier substrate in method step D). A mechanical fixing of the carrier on the carrier substrate can be ensured as a result.

In accordance with at least one embodiment, the contact structures of the covering substrate are produced or formed by being stamped out at least in regions from the carrier substrate. In this case, it is possible that the contact structures are not stamped out completely from the carrier substrate, but rather are still mechanically and electrically conductively connected to the carrier substrate, for example, at one side, that is to say are embodied integrally with the carrier substrate. In this case, electrically conductively connecting in method step F) is preferably effected by folding over the contact structures or the stamped-out part of the carrier substrate which form the contact structures. Alternatively, the contact structures are stamped out from the carrier substrate regionally in such a way that there is once again a mechanical and electrical connection on one side, wherein in this case the stamped-out part of the carrier substrate are bent or led to the contact metallizations of the carrier. In this way, too, it is possible to ensure a planar contact-connection of the contact metallizations with the carrier substrate, without a process of folding over the contact structures being made absolutely necessary in this case.

In one alternative embodiment, the contact structures can be stamped out completely from the carrier substrate. In this case, the carrier substrate and the contact structures are embodied in a plurality of pieces rather than in an integral fashion and in a manner connected to one another. In this case, in method step F) the contact structures are led to the carrier substrate by being folded over, thereby ensuring an electrically conductive connection between contact structures, contact metallizations and carrier substrate.

In accordance with at least one further embodiment, the covering substrate has a radiation-influencing element. A radiation-influencing element is considered to be, in particular, an element which influences the radiation direction and/or the wavelength of the radiation emitted by the semiconductor chip. By way of example, such a radiation-influencing element is an optical element, for example, a lens, or a conversion element. In this case, the covering substrate has the radiation-influencing element as a further component part in addition to the contact structures. In method step E) it is thus advantageously possible in a simplified manner, during the mounting of the contact structures, in the same work step, to mount the radiation-influencing element above the semiconductor chip. In this case, the radiation-influencing element can be prepared for mounting in method step C). Preferably, the radiation-influencing element in this case is embodied in an electrically insulating fashion and mechanically connects the two contact structures of the covering substrate to one another.

In accordance with at least one further embodiment, the electrical contact-connection of the semiconductor chip and of the component is formed in a manner free of plated-through holes through the carrier and the carrier substrate. Plated-through holes are dispensed with completely, in particular. The electrical contact-connection is effected, in particular, by the contact structures of the covering substrate, which enable an electrical connection between contact metallizations of the carrier and the carrier substrate. In this regard, an electrical connection is advantageously effected between the mounting surface of the carrier and that surface of the carrier which faces away from the mounting surface and at which the carrier substrate is arranged.

In accordance with at least one further embodiment, the carrier substrate is formed by a metal foil. Preferably, the covering substrate is formed by a foil having the contact structures. By way of example, the covering substrate is a conversion lamina with contact structures arranged thereon.

In accordance with at least one further embodiment, method step A) involves providing in the wafer assemblage a multiplicity of substrateless optoelectronic semiconductor chips in each case on a carrier. Method step C) involves providing preferably in the wafer assemblage a multiplicity of covering substrates each having at least two contact structures. In this case, the semiconductor chips can be removed from the wafer assemblage and positioned on the desired carrier substrate by a pick-and-place method, for example. The covering substrates, too, can preferably be singulated from the wafer assemblage, for example, by stamping-out, and can be applied to the respectively provided semiconductor chip or carrier in method step E).

In accordance with at least one embodiment, an optoelectronic component comprises an electrically insulating carrier having a mounting surface, wherein at least two electrically conductive contact metallizations which are electrically insulated from one another are applied on the mounting surface. At least one substrateless optoelectronic semiconductor chip is arranged on the mounting surface of the carrier. On an electrically conductive carrier substrate, the carrier is applied by the side facing away from the mounting surface. Electrically conductive contact structures are electrically conductively connected to the electrically conductive contact metallizations of the carrier and the electrically conductive carrier substrate.

The features and advantages mentioned in conjunction with the production method are also used in association with the component, and vice versa.

In accordance with at least one embodiment, the carrier and the carrier substrate are free of plated-through holes. In this case, the contact structures are led around the carrier, in particular, such that the contact structures electrically conductively connect the contact metallizations and the carrier substrate to one another.

In accordance with at least one embodiment, the carrier substrate and the contact structures are embodied in an integral fashion. In this case, the contact structures are bent or folded around the carrier, such that the desired electrical contact-connection can be ensured.

In accordance with at least one embodiment, a radiation-influencing element is arranged on that side of the semiconductor chip which faces away from the carrier. In this case, the radiation-influencing element is preferably mechanically connected to the contact structures. Overall a mechanical stability of the component can advantageously be ensured as a result.

In accordance with at least one embodiment, the electrical contact-connection is free of bonding wires. In particular, the electrical contact-connection is effected by the contact structures, which are preferably embodied in a planar fashion. The component height can advantageously be reduced as a result. In this regard, it is possible to realize very thin and planar components, the small thickness of which is advantageous for many applications.

BRIEF DESCRIPTION OF THE DRAWINGS

Further advantages and advantageous developments of the invention will become apparent from the exemplary embodiments described below in conjunction with FIGS. 1 to 10, in which.

In the figures, identical or identically acting constituent parts may be provided in each case with the same reference signs. The illustrated constituent parts and their size relationships among one another should not be regarded as true to scale. Rather, individual constituent parts such as, for example, layers, structures, component parts and regions may be illustrated with exaggerated thickness or size dimensions in order to enable better illustration and/or in order to afford a better understanding.

DETAILED DESCRIPTION OF ILLUSTRATIVE EMBODIMENTS

Figure 1A:
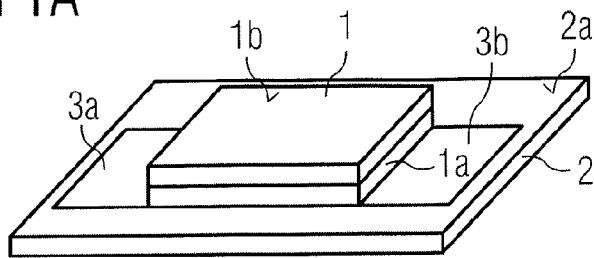
FIGS. 1A to 1D show in each case schematic views of one exemplary embodiment of a semiconductor component according to the invention in the production method.

FIG. 1A shows a view of a first method step for producing an optoelectronic component according to the invention. This first method step involves providing a substrateless optoelectronic semiconductor chip 1 having an active layer 1a provided for generating radiation and a radiation coupling-out side 1b. The semiconductor chip is arranged on a carrier 2 by that side of said semiconductor chip which faces away from the radiation coupling-out side 1b. The carrier 2 has a mounting surface 2a, on which the semiconductor chip 1 is applied. The carrier 2 is an electrically insulating carrier. That means that the carrier 2 consists of an electrically insulating material. Two electrically conductive contact metallizations 3a, 3b electrically insulated from one another are arranged on the mounting surface 2a of the carrier 2. The electrical contact metallizations 3a, 3b are electrically insulated from one another by spacing. The semiconductor chip 1 is applied directly on the first contact metallization 3a and is electrically conductively and mechanically connected thereto.

Figure 1B:
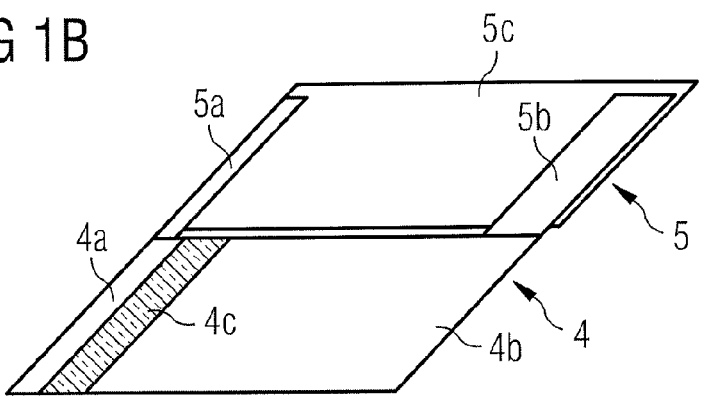

FIG. 1B shows a further method step for producing the optoelectronic component. The method step in FIG. 1B can be carried out at the same time as the method step in FIG. 1A. Alternatively, it is also possible for the method steps in FIGS. 1A, 1B to be carried out temporally successively.

The method step in FIG. 1B involves providing an electrically conducive carrier substrate 4. The carrier substrate is preferably a leadframe. The carrier substrate 4 has a first electrical contact region 4a and a second electrical contact region 4b, which are electrically insulated from one another by an electrically insulating material 4c. Electrically conductive contact structures 5a, 5b of a covering substrate 5 are embodied integrally with the carrier substrate 4. The contact structures 5a, 5b are preferably embodied as contact lugs and are in each case electrically conductively and mechanically connected to a respective contact region of the carrier substrate 4. By way of example, the contact structures 5a, 5b project as contact webs from the carrier substrate 4.

The covering substrate 5 furthermore has a radiation-influencing element 5c, which mechanically connects the contact lugs 5a, 5b to one another. The radiation-influencing element 5c is preferably a conversion lamina suitable for at least partly converting the radiation emitted by the semiconductor chip into radiation having a different wavelength. A component which emits white radiation overall can be realized as a result.

The covering substrate 5 and the carrier substrate 4 form a planar component part in the present case. In particular, the covering substrate 5 and the carrier substrate 4 are arranged alongside one another in a planar fashion.

Figure 1C:
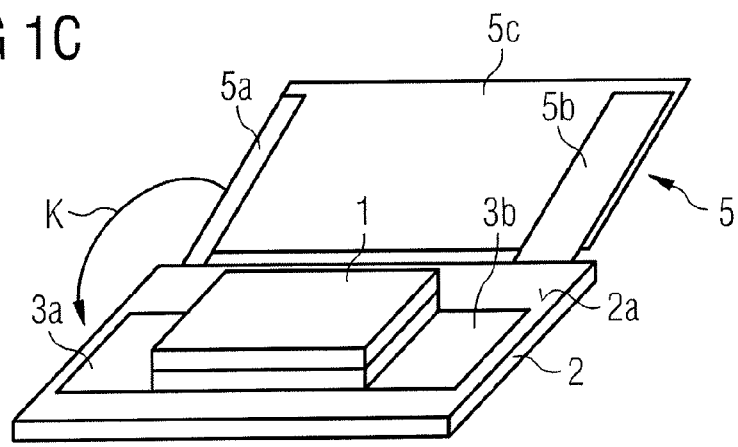

FIG. 1C shows further method steps that are carried out for producing the component. The carrier 2 with semiconductor chip 1 arranged thereon is applied on the carrier substrate by the side facing away from the mounting surface of the carrier and is mechanically connected to said carrier substrate. A bonding method preferably takes place for fixing the carrier 2 on the carrier substrate 4.

Afterward, the covering substrate 5 is applied on the semiconductor chip 1 and on the mounting surface 2a of the carrier 2. The covering substrate 5 is applied in particular by folding over the contact structures 5a, 5b and the conversion lamina 5c in direction K. In particular, the covering substrate 5 is folded over the carrier 2 and the semiconductor chip 1 approximately by 180° in the direction of the carrier substrate. As a result of this folding-over the contact structures 5a, 5b are in direct mechanical and electrically conductive contact respectively with a contact metallization 3a, 3b of the carrier 2. After the folding-over, the conversion lamina 5c is in direct contact with the radiation coupling-out side 1b of the semiconductor chip 1.

The process of folding over the contact structures of the covering substrate onto the contact metallizations of the carrier results in an electrically conductive connection of said contact structures to the contact metallizations and likewise to the electrically conductive carrier substrate 4. In particular, the contact metallizations here are electrically conductively connected in each case via the contact structures to the carrier substrate or the contact regions of the carrier substrate.

Figure 1D:
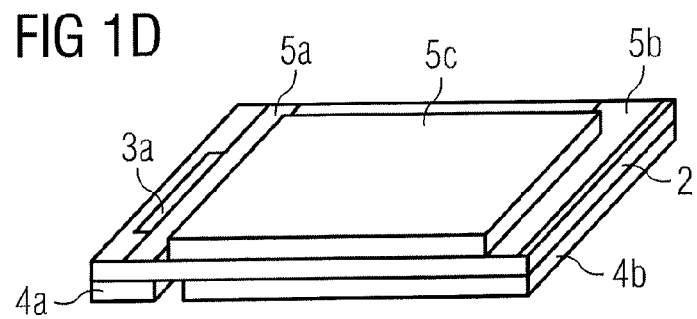

The exemplary embodiment in FIG. 1D shows the component after the covering substrate has been folded over the semiconductor chip and the carrier. The semiconductor chip and the carrier are arranged between carrier substrate 4 and covering substrate 5 after the folding-over. In this case, the conversion element 5c of the covering substrate 5 is arranged directly above the radiation exit side of the semiconductor chip. The contact lugs 5a, 5b are arranged alongside the semiconductor chip 1 in such a way that they are in direct contact with a respective contact metallization 3a, 3b of the carrier 2. The contact lugs lead to the respective contact regions 4a, 4b of the carrier substrate 4 on account of the folding-over process at a side of the carrier.

Figure 2:
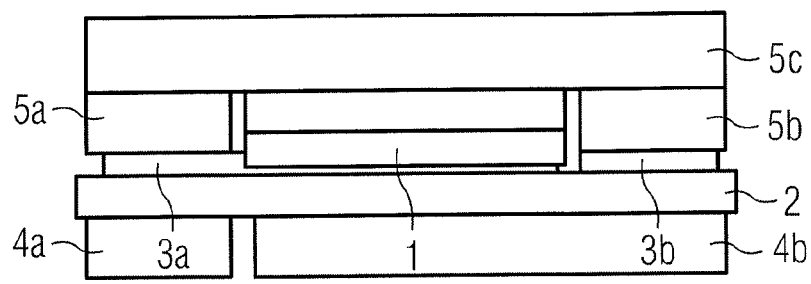
FIGS. 2, 3 show in each case a schematic cross section of the exemplary embodiment of the semiconductor component according to the invention from FIG. 1 in the finished state.

FIG. 2 shows a schematic cross section of the finished produced component from FIG. 1D. The finished produced component has the following component parts, then, from the bottom to the top: contact regions 4a, 4b of the carrier substrate 4, carrier 2, contact metallizations 3a, 3b of the carrier 2, contact structures 5a, 5b and semiconductor chip 1, conversion lamina 5. Spacings are preferably used for electrically insulating the individual electrical component parts. The semiconductor chip 1 is enclosed by the conversion lamina 5, by the contact structures 5a, 5b and by the carrier 2 with contact metallizations arranged thereon. As a result, the semiconductor chip can advantageously be protected against outer external influences.

Figure 3:
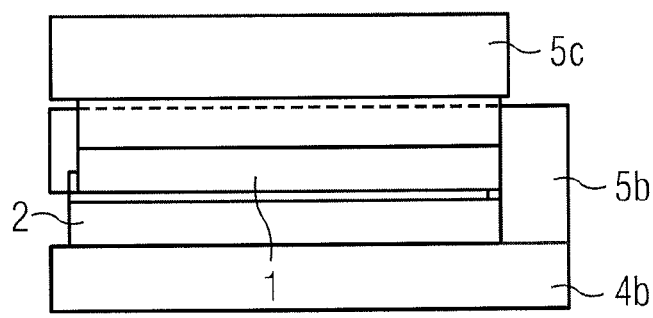

FIG. 3 illustrates a lateral cross section of the finished produced component from FIG. 1D. In particular the folded contact routing of the contact structures can be discerned in this lateral view. In particular, FIG. 3 shows that the contact structures 5a, 5b have an L-shaped configuration after the folding process, such that an electrically conductive connection of the contact metallizations to the electrically conductive carrier substrate can be ensured. In this case, the carrier substrate 4 and the contact structures 5a, 5b are embodied in an integral fashion and overall have the shape of a horizontal U.

By virtue of the electrical contact-connection via the contact structures, it is possible to realize a component which is free of plated-through holes through the carrier 2 and the carrier substrate 4. The contact routing is effected in particular laterally with respect to the semiconductor chip and the carrier. In this regard, advantageously, no wire contact-connections are required, such that overall the component height is advantageously reduced. On account of the plated-through holes not being necessary, the production process can, moreover, be simplified and at the same time carried out cost-effectively.

Figure 4:
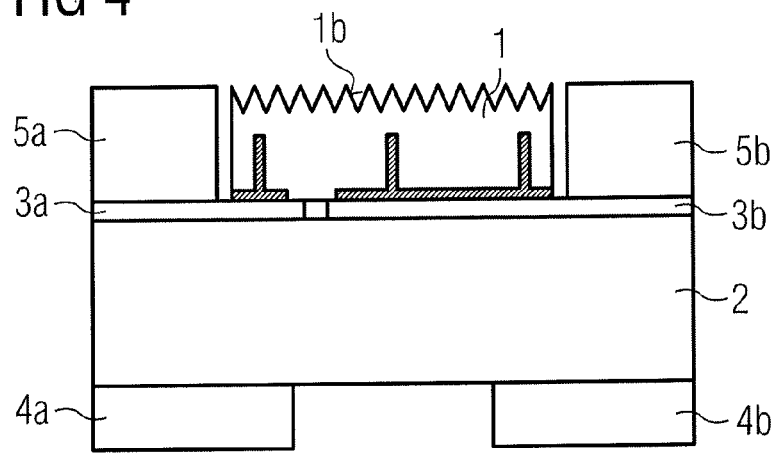
FIG. 4 shows a schematic cross section of one exemplary embodiment of a semiconductor component according to the invention.

FIG. 4 shows a further component produced substantially by a production method in accordance with the exemplary embodiment in FIGS. 1A to 1D. The semiconductor chip 1 is once again arranged on a carrier 2 and electrically conductively and mechanically connected to electrically conductive contact metallizations 3a, 3b of the carrier 2. The carrier 2 is arranged on an electrically conductive carrier substrate 4 having two contact regions 4a, 4b. The electrical connection between contact metallization of the carrier and contact regions of the carrier substrate is effected by contact structures 5a, 5b which are embodied integrally with the carrier substrate 4 and ensure the electrically conductive connection by folding-over. In this case, a respective contact structure 5a, 5b is arranged alongside the semiconductor chip on a contact metallization.

In contrast to the exemplary embodiment illustrated in FIGS. 1 to 3, the semiconductor chip in FIG. 4 has a roughening or a three-dimensionally structured radiation exit surface 1b, whereby the efficiency for coupling radiation out from the semiconductor chip is advantageously increased. Moreover, the exemplary embodiment in FIG. 4 differs in that the covering substrate 5 does not comprise a conversion element. In this exemplary embodiment, the covering substrate 5 is formed only from the electrically conductive contact structures 5a, 5b. That means that only the contact structures are applied on the carrier during the process of folding over the covering substrate.

Figure 5A:
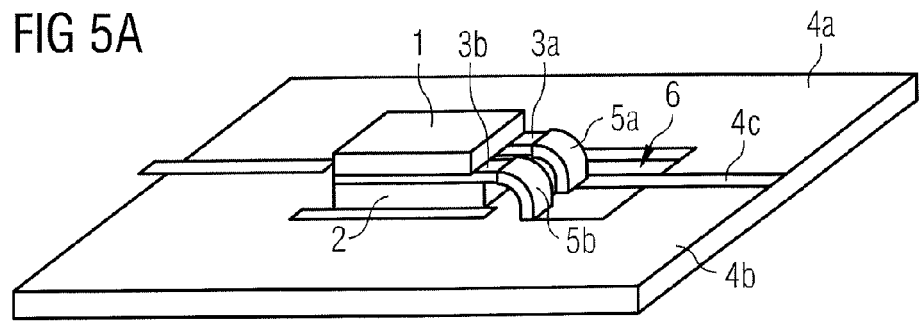
FIGS. 5A, 5B show in each case a schematic view of one exemplary embodiment of a semiconductor component according to the invention.

FIG. 5A shows a further exemplary embodiment of a finished produced semiconductor component, which, in contrast to the exemplary embodiment in FIGS. 1 to 3, comprises no radiation-influencing element of the covering substrate. In particular, the covering substrate 5 is formed only from the electrically conductive contact structures 5a, 5b. The radiation exit side 1b of the semiconductor chip 1 is free of any component parts. As a further difference with respect to the exemplary embodiment in FIGS. 1 to 3, the contact structures 5a, 5b of the covering substrate are formed by being stamped out from the carrier substrate. The carrier substrate 4 accordingly has two stamped-out regions 6a, 6b. In this case, the contact structures 5a, 5b are stamped out only regionally, such that, at least at one side of the contact structures, the latter are still electrically conductively and mechanically connected to the carrier substrate 4. For electrically conductively connecting the contact metallizations 3a, 3b of the carrier 2 to the contact regions of the carrier substrate 4, the stamped-out contact structures 5a, 5b are bent out or folded from the carrier substrate 4 in such a way that the contact structures 5a, 5b are led laterally at the carrier 2 to the contact metallizations 3a, 3b. In this case, the contact structures 5a, 5b are preferably connected to the carrier substrate 4 at that side of the stamped-out region 6 which is adjacent to the semiconductor chip or to the carrier 2.

Figure 5B:
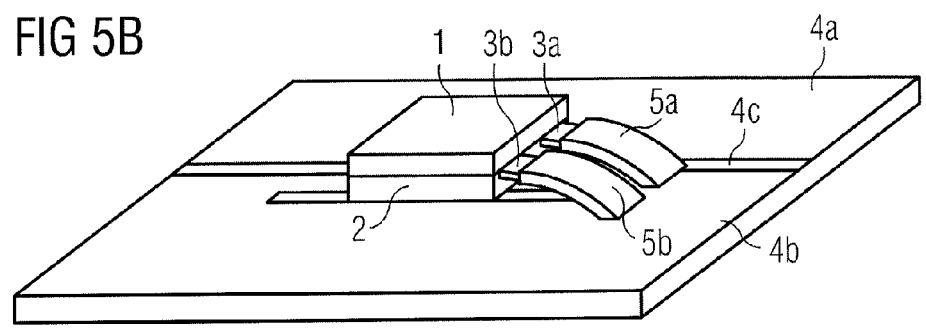

The exemplary embodiment in FIG. 5B differs from the exemplary embodiment in FIG. 5A in that the contact structures 5a, 5b are mechanically and electrically conductively connected to the carrier substrate 4 at that side of the stamped-out region which faces away from the carrier and the semiconductor chip 1. For the purpose of electrically connecting the contact metallizations to the contact regions, the contact structures are not folded over, but rather merely led upward to the contact metallizations. The contact structures accordingly form a type of bridge between contact metallization and contact region of the carrier substrate. In this regard, a planar contact routing can advantageously be realized which does not necessarily comprise folding-over or folding of the contact structures.

The contact regions of the carrier substrate 4 are preferably electrically insulated from one another by a plastic insulation 4c.

Figure 6:
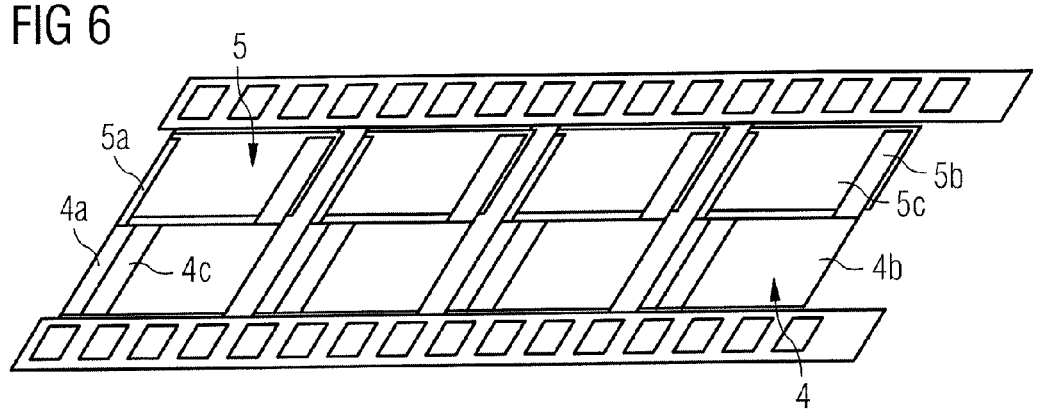
FIG. 6 shows a schematic view of a method step for producing a semiconductor component according to the invention in the wafer assemblage.

The production method illustrated in FIG. 1 can be carried out in the wafer assemblage. This involves providing a multiplicity of substrateless optoelectronic semiconductor chips in each case on a carrier. Moreover, a multiplicity of covering substrates each having at least two contact structures are provided in the wafer assemblage. Such a wafer assemblage of covering substrates 5 is illustrated schematically by way of example in FIG. 6. In this case, the covering substrate 5 is embodied integrally with the carrier substrate 4, as has already been explained in the exemplary embodiment in FIG. 1B. A metal foil is preferably used as the carrier substrate 4, said metal foil having the contact structures 5a, 5b of the covering substrate 5 as contact lugs. The covering substrate 5 additionally has a conversion lamina 5c, which in each case mechanically connects the contact structures to one another. The conversion laminae 5c are prepared in this case on the carrier substrate 4, which is preferably a leadframe. In particular, a metal-plastic laminate is used. The covering substrate 5 is preferably formed by a foil with contact structures 5a, 5b applied thereon.

During the production of the individual components, the component parts provided in the wafer assemblage are preferably separated to form in each case a respective semiconductor component by a pick-and-place method.

An alternative production method is shown in the exemplary embodiment in FIGS. 7A to 7D. The method step in FIG. 7A once again involves providing a substrateless semiconductor chip 1 on a carrier 2, wherein the carrier 2 once again comprises two electrically conductive contact metallizations on a mounting surface 2a. In particular, the exemplary embodiment in FIG. 7A corresponds to the exemplary embodiment in FIG. 1A.

Figure 7A:
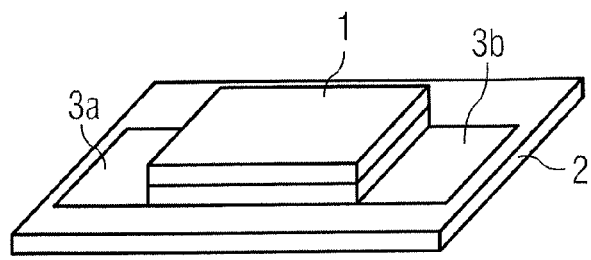
FIGS. 7A to 7D show in each case a schematic view of one exemplary embodiment of a semiconductor component according to the invention in the production method.
Figure 7B:
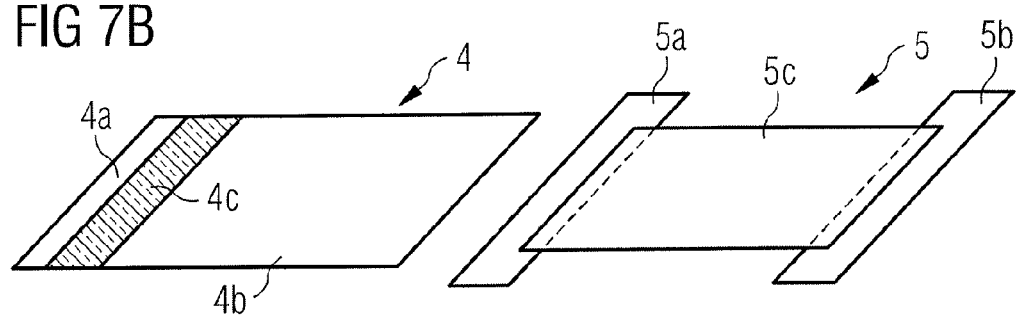

The further method step in FIG. 7B involves providing the carrier substrate 4 comprising the two electrically conductive contact regions 4a, 4b electrically insulated from one another. Moreover, the covering substrate 5 is provided, which, in the present case, is not embodied integrally with the carrier substrate, but rather is produced as a separate component part. The covering substrate 5 comprises two electrically conductive contact structures 5a, 5b electrically insulated from one another, which are mechanically connected to one another by a covering foil 5c. The covering substrate 5 is accordingly preferably a foil with contact lugs 5a, 5b laminated thereon. The covering substrate 5 is preferably a metal-plastic laminate.

Figure 7C:
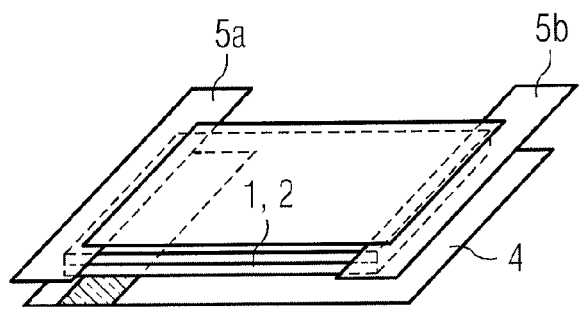

In the next method step in FIG. 7C, the carrier with semiconductor chip applied thereon is bonded onto the carrier substrate 4. Afterward, the separate covering substrate is laminated onto the semiconductor chip and the carrier. In particular, the contact structures of the covering substrate are applied directly on the contact metallizations of the carrier and are electrically conductively and mechanically connected thereto. The covering foil is applied on a radiation exit side of the semiconductor chip. In order then to realize an electrically conductive connection between the contact metallizations of the carrier and the carrier substrate, the contact structures of the covering substrate are bent laterally at the carrier in the direction of the contact regions of the carrier substrate. As a result, the contact lugs of the covering substrate are electrically conductively connected to the contact regions of the carrier substrate. Folding as illustrated in the exemplary embodiment in FIG. 1 is advantageously not necessary in this case.

Figure 7D:
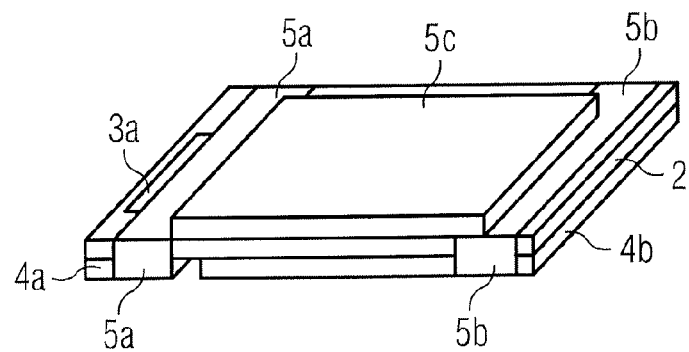

The finished produced component is illustrated in the exemplary embodiment in FIG. 7D. The covering foil of the covering substrate 5 can be detached or removed from the component after the electrically conductive connection has been produced. In this case, the radiation exit surface of the semiconductor chip is free of further component parts. Alternatively, the covering foil can be a conversion lamina which is also furthermore used on the radiation exit surface of the semiconductor chip in the finished produced component.

If the component is produced in the wafer assemblage, it can be separated from the wafer assemblage by stamping-out after the method step in FIG. 7D.

Figure 8:
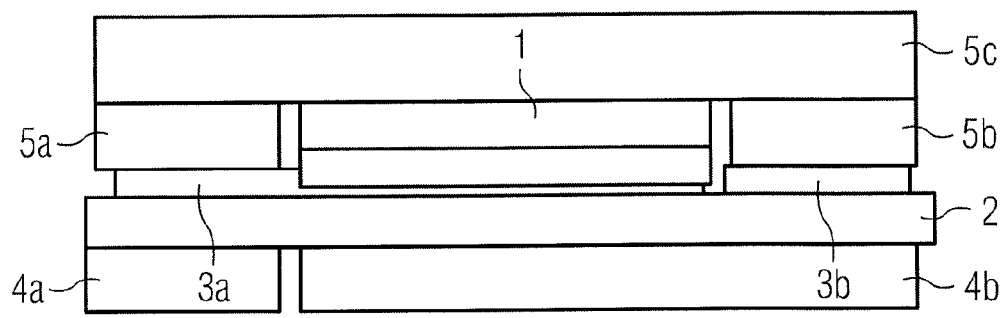
FIGS. 8, 9 show in each case a schematic cross section of the exemplary embodiment of the semiconductor component according to the invention from FIG. 7 in the finished state.

The finished produced component from FIG. 7D is illustrated in cross section in the exemplary embodiment in FIG. 8. The component thus produced does not differ from the component in FIG. 2 in this cross section.

Figure 9:
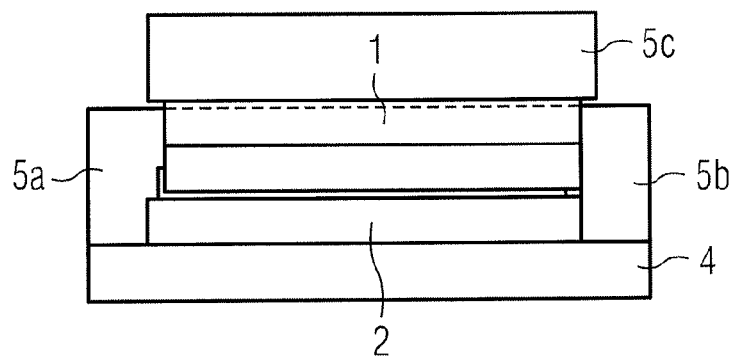

FIG. 9 illustrates a lateral cross section of the component from FIG. 7D. This lateral cross section differs from the exemplary embodiment in FIG. 3 in that the contact structures 5a, 5b and the carrier substrate 4 are not embodied in an integral fashion. These two component parts are embodied in particular as separate component parts and are electrically conductively connected to one another. The contact structures have an upside down U-shaped configuration and are electrically conductively connected to the carrier substrate in addition to the carrier.

As a further difference with respect to the exemplary embodiment illustrated in FIG. 3, the contact structures are bent at both sides of the carrier in the direction of the carrier substrate. The contact structures 5a, 5b and the carrier substrate accordingly together form an O-shape.

Figure 10:
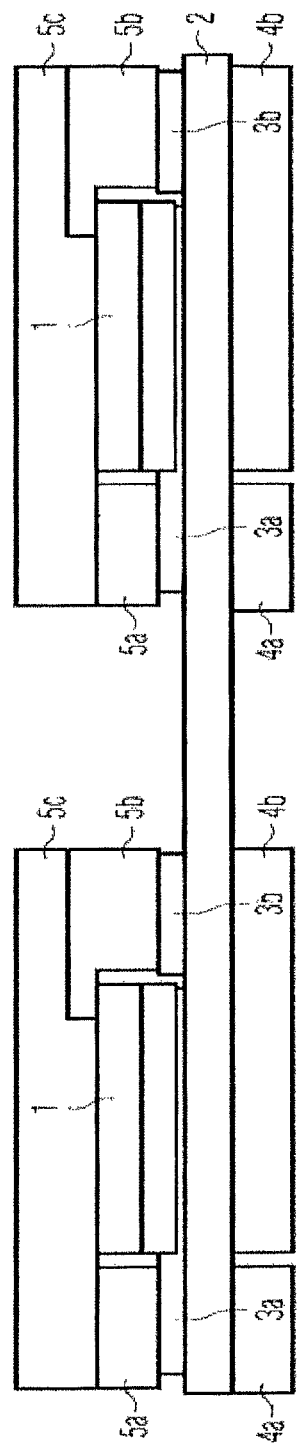
FIG. 10 shows a schematic cross section of one exemplary embodiment of a semiconductor component according to the invention.

A further embodiment of the component described here can comprise a plurality of semiconductor chips. For this purpose, the chip contacts can be electrically connected to the contact metallizations and/or to the contact structures, for example, by a covering substrate 5 laminated onto the chips. The exemplary embodiment in FIG. 10 illustrates a component comprising two semiconductor chips in cross section, said semiconductor chips being produced, for example, according to the production method from FIGS. 7A to 7C. A further possibility of chip contact-connection is illustrated, wherein, for example, electrically conductive contact structures 5b make contact with the respective semiconductor chip 1 at the top side thereof. A second contact-connection of the semiconductor chips 1 is arranged at the chip undersides, for example, in accordance with the exemplary embodiments from FIGS. 1 to 9 already described. An electrical contact-connection is effected, for example, with the electrically conductive contact metallizations 3a. After the covering substrate 5 has been laminated onto the semiconductor chips, for example, the contact structures 5a respectively connect the contact metallizations 3a to the contact on the underside of the respective semiconductor chip and the carrier substrate 4. The contact structures 5b on the top side of the respective semiconductor chip are contact-connected to the respective contact metallization 3b and the carrier substrate 4, for example, as a result of the lamination of the covering substrate 5. Consequently, an arrangement of a plurality of semiconductor chips can be electrically contact-connected.

Furthermore, it is possible by contact structures in the covering substrate, for example, to interconnect a plurality of semiconductor chips with one another. As a result, for example, chips can be interconnected with one another at their top-side contacts by the covering substrate.

The invention is not restricted to the exemplary embodiments by the description on the basis of said exemplary embodiments, but rather encompasses any novel feature and also any combination of features, which in particular includes any combination of features in the patent claims, even if these features or these combinations themselves are not explicitly specified in the claims or exemplary embodiments.

The invention claimed is:

1. A method for producing an optoelectronic component, the method comprising:
    providing a optoelectronic semiconductor chip arranged on a mounting surface of an electrically insulating carrier, wherein a plurality of electrically conductive contact metallizations are disposed on the mounting surface, the electrically conductive contact metallizations being insulated from one another;
    providing an electrically conductive carrier substrate;
    providing a covering substrate that has a plurality of electrically conductive contact structures that are electrically insulated from one another;
    applying the electrically insulating carrier with the optoelectronic semiconductor chip arranged thereon on the electrically conductive carrier substrate;
    applying the covering substrate on the optoelectronic semiconductor chip and/or on the mounting surface of the electrically insulating carrier; and
    electrically conductively connecting the electrically conductive contact structures to the electrically conductive contact metallizations and the electrically conductive carrier substrate by folding over the contact structures of the covering substrate.

2. The method according to claim 1, wherein the electrically conductive carrier substrate and the contact structures of the covering substrate are embodied in an integral fashion.

3. The method according to claim 1, wherein the contact structures of the covering substrate are formed by being stamped out at least in regions from the electrically conductive carrier substrate.

4. The method according to claim 1, wherein the covering substrate has a radiation-influencing element.

5. The method according to claim 1, wherein the electrically conductively connecting is performed in a manner free of plated-through holes through the electrically insulating carrier and the electrically conductive carrier substrate.

6. The method according to claim 1, wherein the electrically conductive carrier substrate is formed by a metal foil.

7. The method according to claim 1, wherein the covering substrate is formed by a foil having the contact structures.

8. The method according to claim 1, wherein providing the optoelectronic semiconductor chip comprises providing a plurality of optoelectronic semiconductor chips in a wafer assemblage, each substrateless optoelectronic semiconductor chip being disposed on an electrically insulating carrier, and wherein providing the covering substrate comprises providing a plurality of covering substrates in the wafer assemblage, each covering substrate having a plurality of contact structures.

9. The method of claim 1, wherein the produced optoelectronic component comprises:
    the electrically insulating carrier;
    the optoelectronic semiconductor chip arranged on the mounting surface of the electrically insulating carrier; and
    the electrically conductive carrier substrate, wherein the electrically insulating carrier is disposed on the electrically conductive carrier substrate,
    wherein the contact structures of the covering substrate are electrically conductively connected to the electrically conductive contact metallizations and the electrically conductive carrier substrate and are bent laterally at the electrically insulating carrier in a direction of the electrically conductive carrier substrate.

10. A method for producing an optoelectronic component, the method comprising:
    providing a optoelectronic semiconductor chip arranged on a mounting surface of an electrically insulating carrier, wherein a plurality of electrically conductive contact metallizations are disposed on the mounting surface, the electrically conductive contact metallizations being insulated from one another;
    providing an electrically conductive carrier substrate;
    providing a covering substrate that has a plurality of electrically conductive contact structures that are electrically insulated from one another;
    applying the electrically insulating carrier with the optoelectronic semiconductor chip arranged thereon on the electrically conductive carrier substrate;
    applying the covering substrate on the optoelectronic semiconductor chip and/or on the mounting surface of the electrically insulating carrier; and
    electrically conductively connecting the electrically conductive contact structures to the electrically conductive contact metallizations and the electrically conductive carrier substrate, the produced optoelectronic component comprising:
        the electrically insulating carrier;
        the optoelectronic semiconductor chip arranged on the mounting surface of the electrically insulating carrier; and the electrically conductive carrier substrate, wherein the electrically insulating carrier is disposed on the electrically conductive carrier substrate, wherein the contact structures of the covering substrate are electrically conductively connected to the electrically conductive contact metallizations and the electrically conductive carrier substrate and are bent laterally at the electrically insulating carrier in a direction of the electrically conductive carrier substrate.

11. A method for producing an optoelectronic component, the method comprising:

providing a optoelectronic semiconductor chip arranged on a mounting surface of an electrically insulating carrier, wherein a plurality of electrically conductive contact metallizations are disposed on the mounting surface, the electrically conductive contact metallizations being insulated from one another;

providing an electrically conductive carrier substrate;

providing a covering substrate that has a plurality of electrically conductive contact structures that are electrically insulated from one another;

applying the electrically insulating carrier with the optoelectronic semiconductor chip arranged thereon on the electrically conductive carrier substrate;

applying the covering substrate on the optoelectronic semiconductor chip and/or on the mounting surface of the electrically insulating carrier; and electrically conductively connecting the electrically conductive contact structures to the electrically conductive contact metallizations and the electrically conductive carrier substrate, wherein the contact structures of the covering substrate are formed by being stamped out at least in regions from the electrically conductive carrier substrate.

12. The method according to claim 11, wherein the electrically conductively connecting is effected by folding over the contact structures of the covering substrate.

13. A method for producing an optoelectronic component, the method comprising:

providing a optoelectronic semiconductor chip arranged on a mounting surface of an electrically insulating carrier, wherein a plurality of electrically conductive contact metallizations are disposed on the mounting surface, the electrically conductive contact metallizations being insulated from one another;

providing an electrically conductive carrier substrate;

providing a covering substrate that has a plurality of electrically conductive contact structures that are electrically insulated from one another;

applying the electrically insulating carrier with the optoelectronic semiconductor chip arranged thereon on the electrically conductive carrier substrate;

applying the covering substrate on the optoelectronic semiconductor chip and/or on the mounting surface of the electrically insulating carrier; and electrically conductively connecting the electrically conductive contact structures to the electrically conductive contact metallizations and the electrically conductive carrier substrate, wherein providing the optoelectronic semiconductor chip comprises providing a plurality of optoelectronic semiconductor chips in a wafer assemblage, each optoelectronic semiconductor chip being disposed on an electrically insulating carrier, and wherein providing the covering substrate comprises providing a plurality of covering substrates in the wafer assemblage, each covering substrate having a plurality of contact structures.

* * * * *

UNITED STATES PATENT AND TRADEMARK OFFICE
CERTIFICATE OF CORRECTION

PATENT NO. : 9,543,479 B2
APPLICATION NO. : 14/380688
DATED : January 10, 2017
INVENTOR(S) : Siegfried Herrmann Page 1 of 1

It is certified that error appears in the above-identified patent and that said Letters Patent is hereby corrected as shown below:

In the Claims

In Column 12, Line 19, Claim 8, delete "substrateless".

Signed and Sealed this
Thirtieth Day of May, 2017

Michelle K. Lee
*Director of the United States Patent and Trademark Office*